(12) United States Patent
Yu et al.

(10) Patent No.: US 6,191,044 B1
(45) Date of Patent: Feb. 20, 2001

(54) METHOD FOR FORMING GRADED LDD TRANSISTOR USING CONTROLLED POLYSILICON GATE PROFILE

(75) Inventors: Allen S. Yu, Fremont; Patrick K. Cheung, Sunnyvale; Paul J. Steffan, Elk Grove, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/169,275

(22) Filed: Oct. 8, 1998

(51) Int. Cl.[7] .................... H01L 21/302; H01L 21/461; H01L 21/336; H01L 21/3205; H01L 21/4763

(52) U.S. Cl. .................... 438/713; 438/303; 438/595; 438/305

(58) Field of Search .................... 438/305, 713, 438/303, 301, 299, 595, 197

(56) References Cited

U.S. PATENT DOCUMENTS

| | | | |
|---|---|---|---|
| 4,558,338 | * 12/1985 | Sakata | 357/23.9 |
| 5,834,817 | * 11/1998 | Satoh et al. | 257/387 |
| 5,937,299 | * 8/1999 | Michael et al. | 438/299 |
| 6,013,570 | * 1/2000 | Yu et al. | 438/595 |

* cited by examiner

Primary Examiner—Richard Elms
Assistant Examiner—Adam Pyonin
(74) Attorney, Agent, or Firm—Mikio Ishmaru

(57) ABSTRACT

An ultra-large scale CMOS integrated circuit semiconductor device with LDD structures having reduced polysilicon gate length, reduced parasitic capacitance and gradual doping profiles is manufactured by forming a gate oxide layer over the semiconductor substrate; forming a polysilicon layer over the gate oxide layer; forming a first mask layer over the polysilicon layer; patterning and etching the first mask layer to form a first gate mask; anisotropically etching the polysilicon layer to form a polysilicon gate, wherein the polysilicon gate comprises sidewalls with re-entrant profiles, and implanting the semiconductor substrate with a dopant to penetrate portions of the sidewalls to form one or more graded shallow junctions with gradual doping profiles. The gradual doping profiles reduce parasitic capacitance and minimize hot carrier injections. Portions of the polysilicon gates with re-entrant profiles are used as mask during the ion implantation of the LDD structures to space the resultant LDD structures away from the edges of the bottom portion of the polysilicon gates. Since the LDD structures are spaced away from the edges of the polysilicon gates, the lateral diffusion of the LDD structures into the channel due to rapid thermal annealing is reduced. This results in CMOS devices with reduced parasitic capacitance.

18 Claims, 14 Drawing Sheets

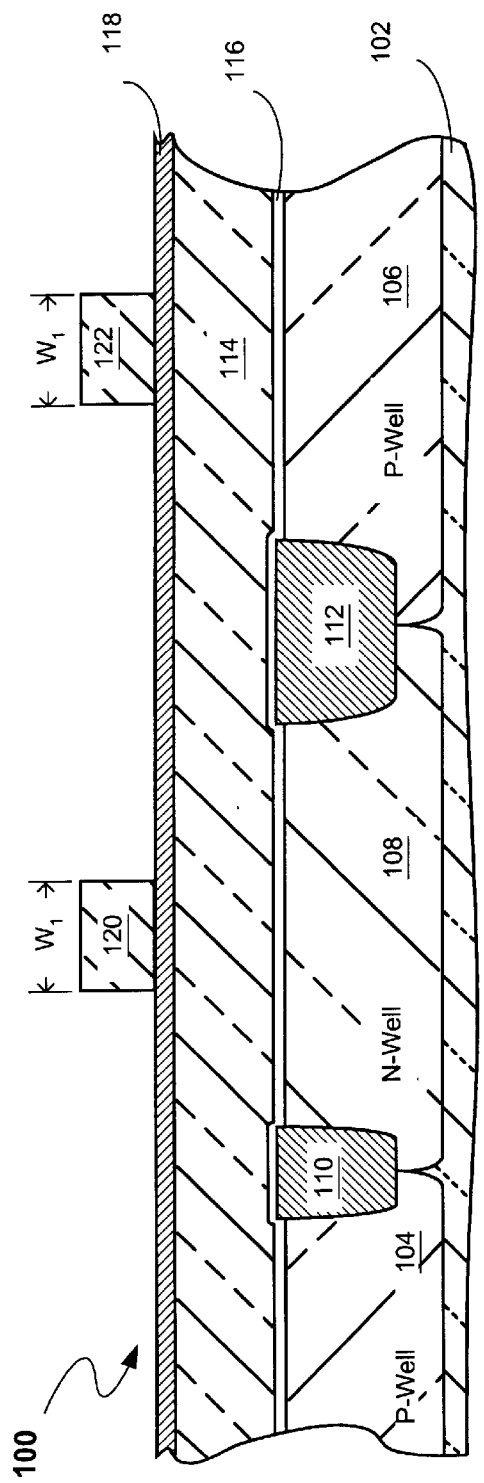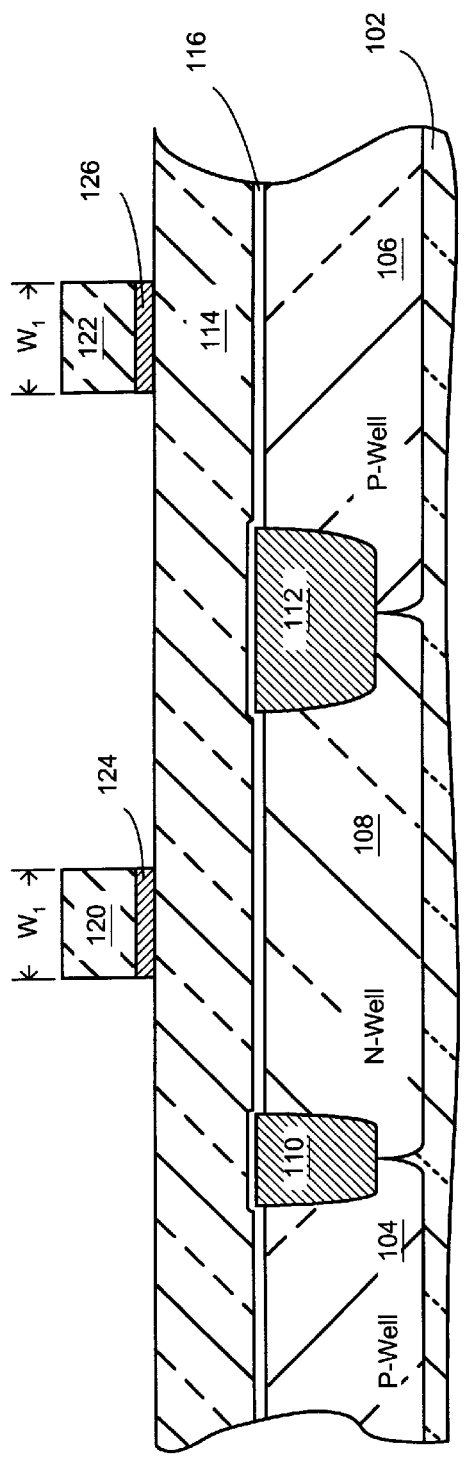
FIG. 1A (PRIOR ART)
FIG. 1B (PRIOR ART)

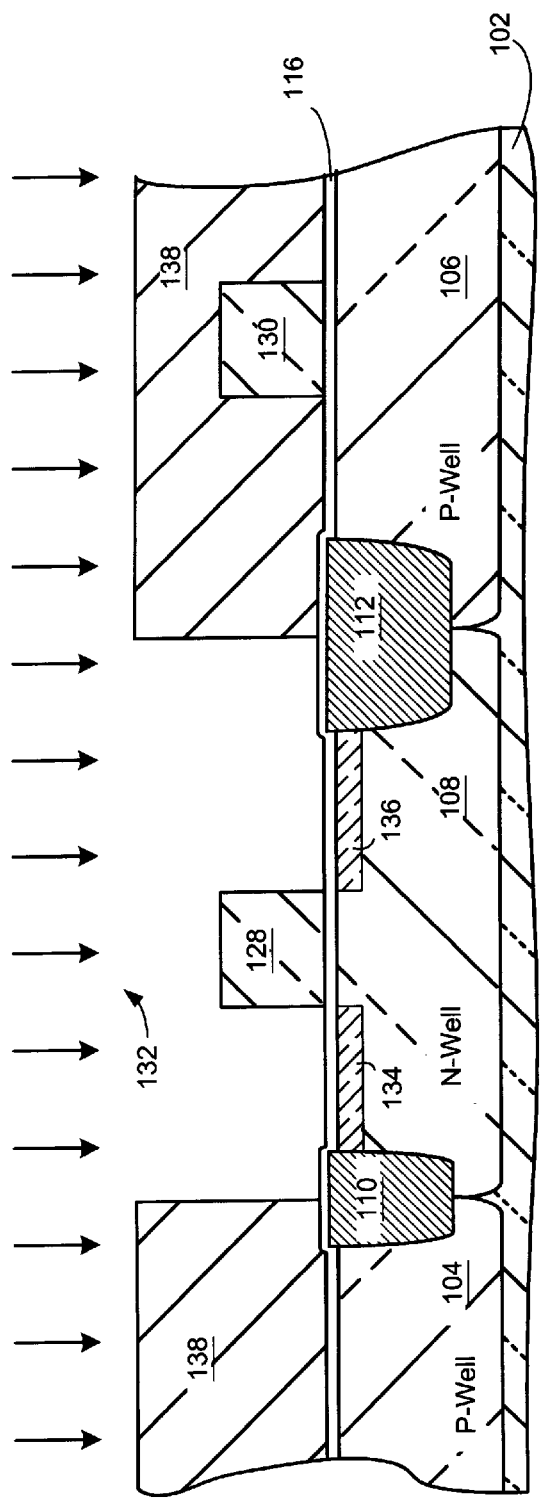
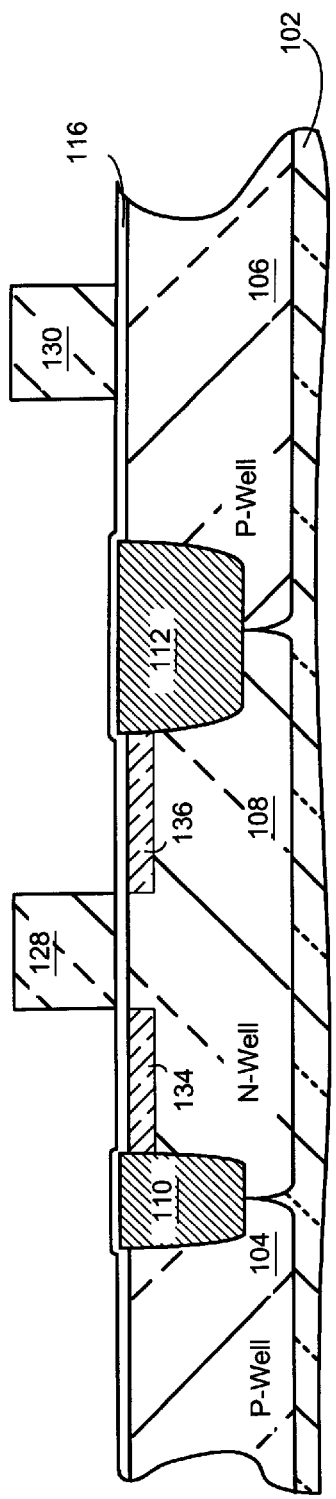
FIG. 1E (PRIOR ART)
FIG. 1F (PRIOR ART)

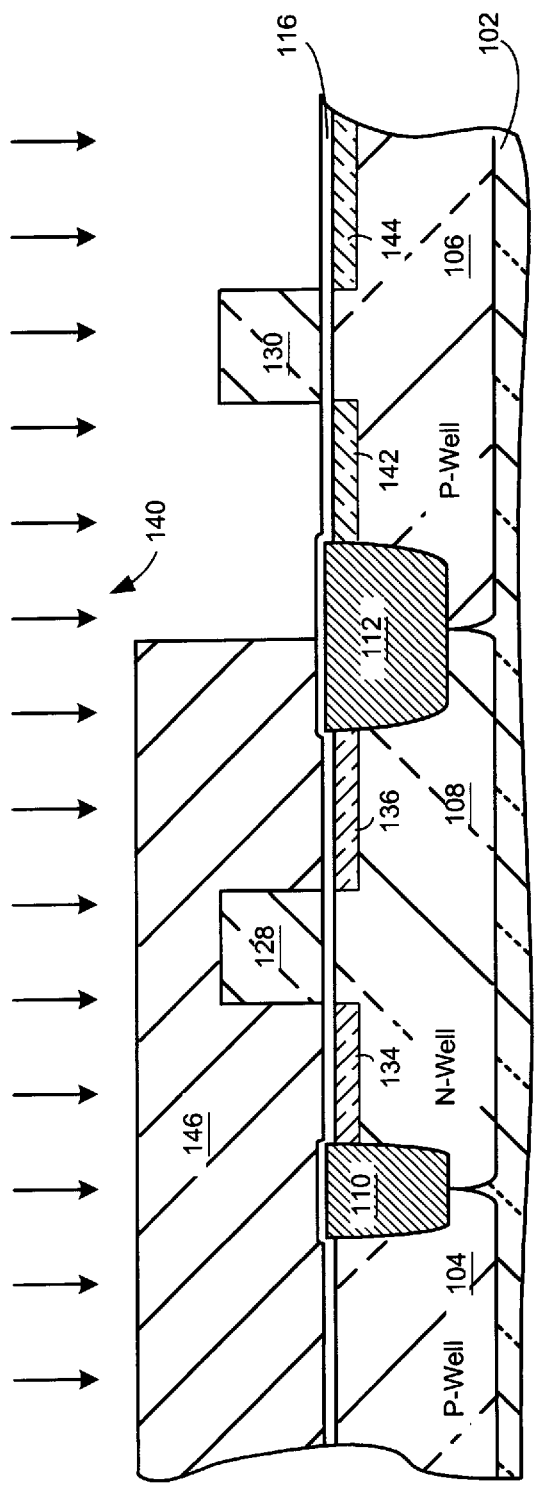
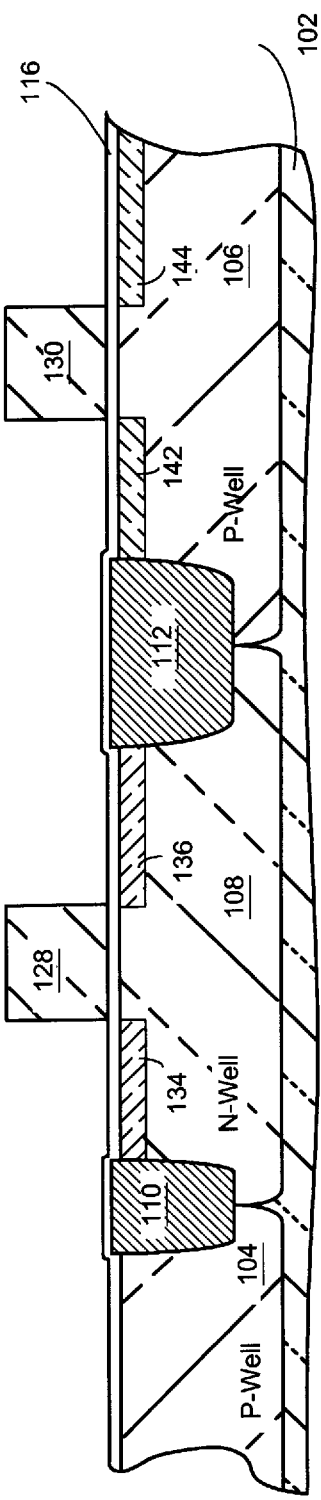

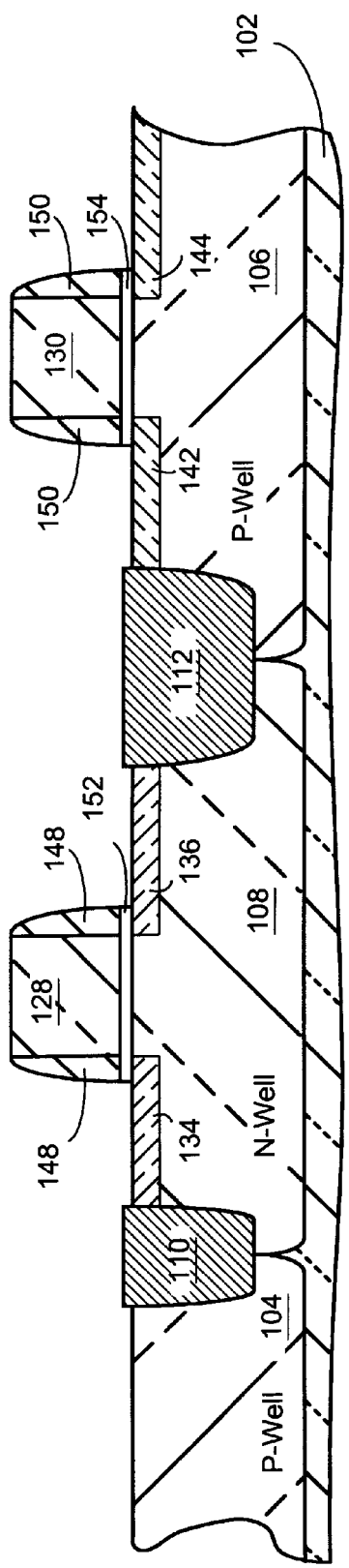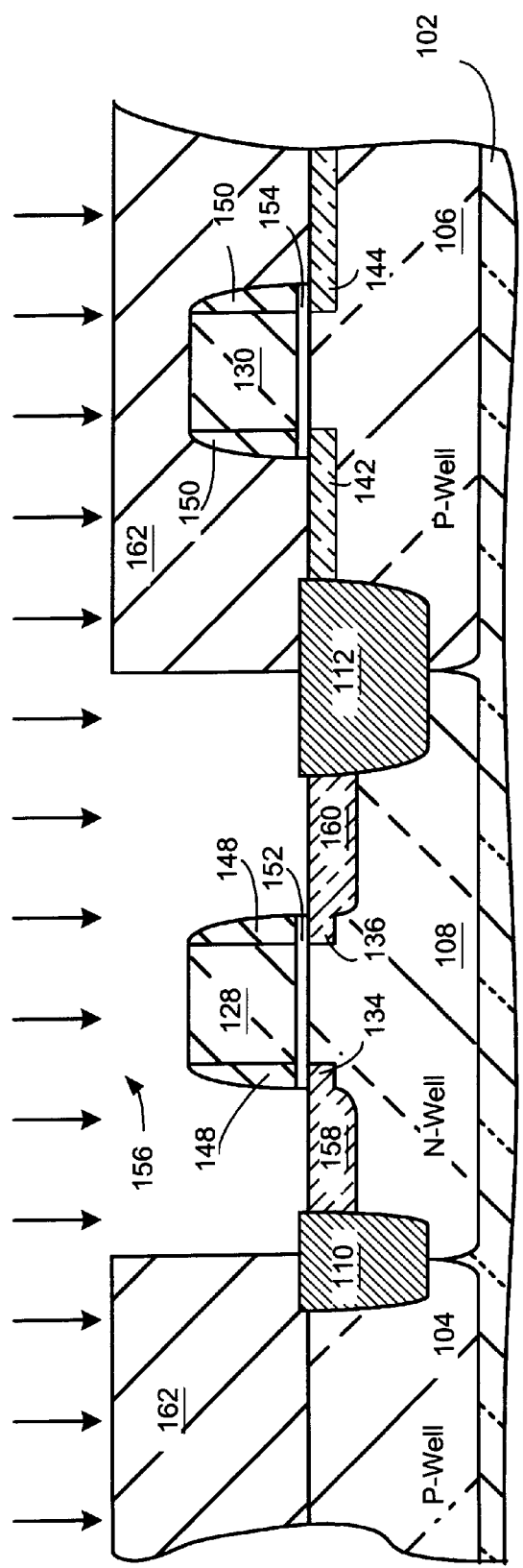
FIG. 1I (PRIOR ART)
FIG. 1J (PRIOR ART)

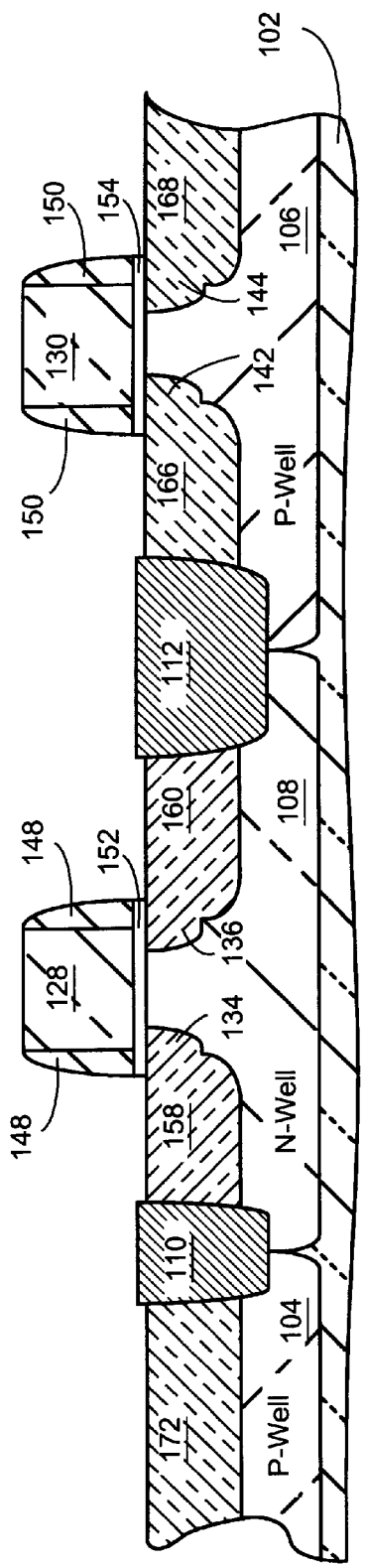
FIG. 1M (PRIOR ART)
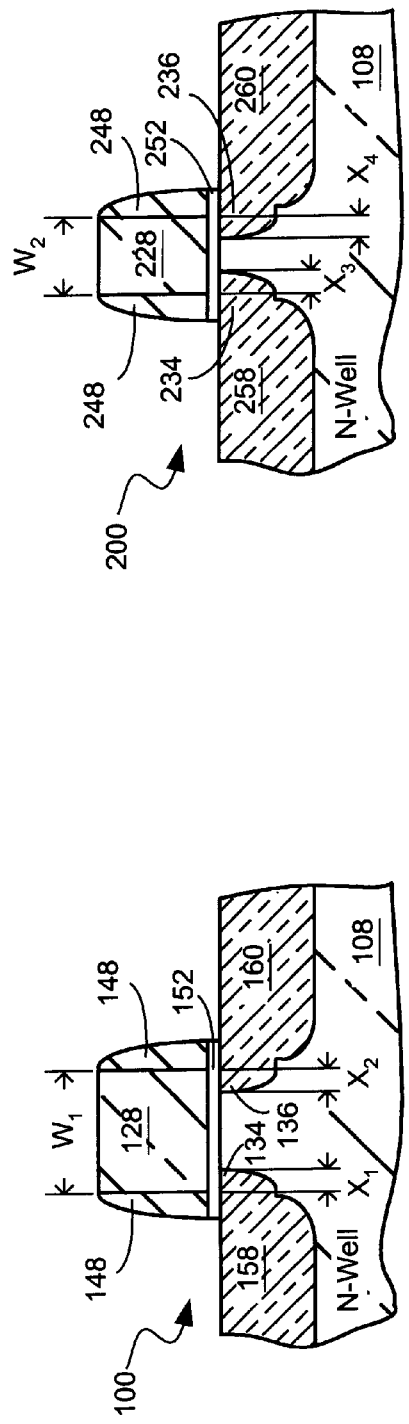
FIG. 2B (PRIOR ART)
FIG. 2A (PRIOR ART)

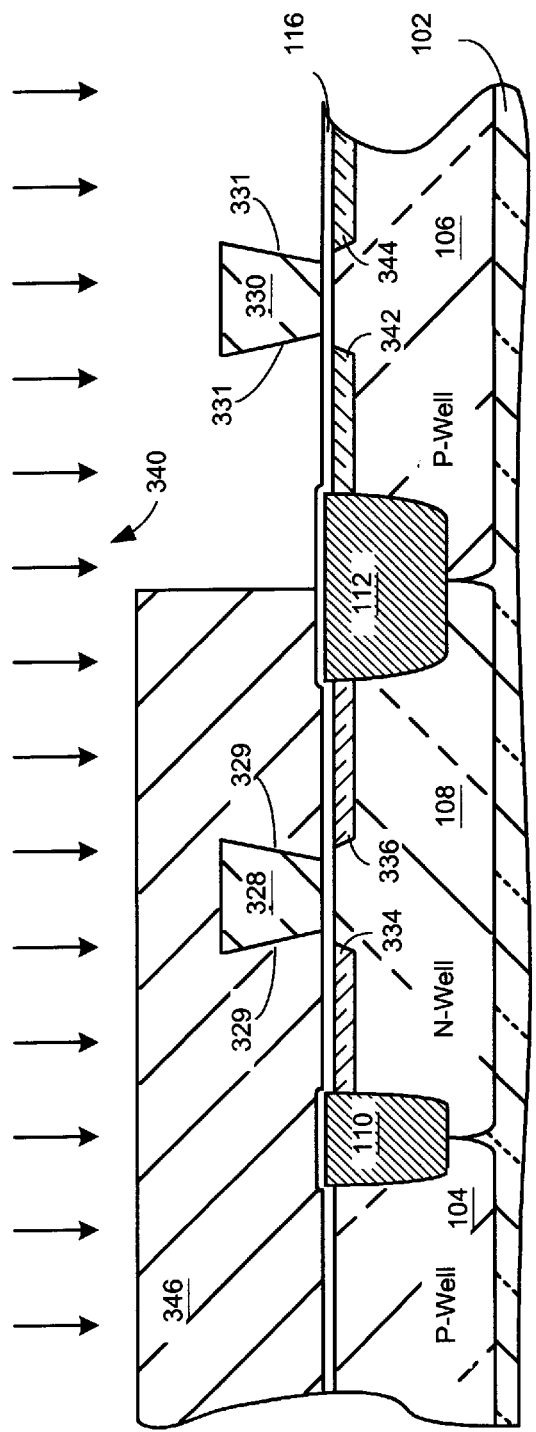
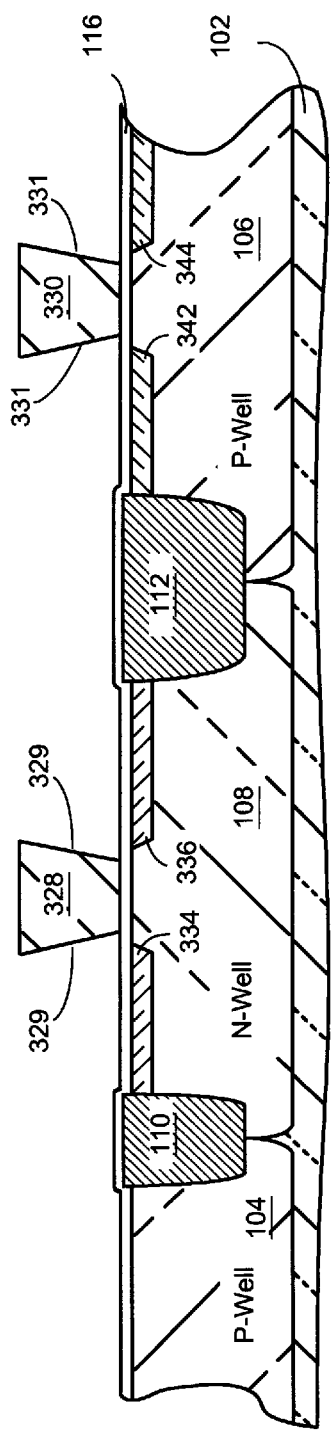
FIG. 3G
FIG. 3H

METHOD FOR FORMING GRADED LDD TRANSISTOR USING CONTROLLED POLYSILICON GATE PROFILE

TECHNICAL FIELD

The present invention relates generally to manufacturing semiconductors and more specifically to a manufacturing method for Metal-Oxide-Semiconductors (MOS) which employ lightly doped drain (LDD) structures.

BACKGROUND ART

Complementary Metal-Oxide-Semiconductor (CMOS) is the primary technology for ultra large-scale integrated (ULSI) circuits. These ULSI circuits combine two types of Metal-Oxide-Semiconductor (MOS) devices, namely P-channel Metal-Oxide-Semiconductor (PMOS) devices and N-channel Metal-Oxide-Semiconductor (NMOS) devices, on the same integrated circuit. To gain performance advantages, scaling down the size of MOS devices has been the principal focus of the microelectronics industry over the last two decades.

The conventional process of manufacturing MOS devices involves doping a silicon substrate and forming a gate oxide on the substrate followed by a deposition of polysilicon. A photolithographic process is used to etch the polysilicon to form the device gate.

As the demand for higher performance semiconductor devices continues, smaller gate length (critical dimension) is the remedy of choice. Because the desired gate length is smaller than the smallest gate length current lithography light sources can provide, alternative methods have been developed to reduce the gate length. One such technique is trimming the polysilicon gate photoresist mask to smaller dimensions using an anisotropic oxygen plasma process prior to when the gate etch begins. Subsequently, the polysilicon gates are formed using a conventional etching process. The polysilicon gates thus formed replicate the dimensions of the trimmed photoresist masks, resulting in smaller gate lengths. While this approach is still viable, there are several problems associated with the photoresist mask trimming technique, namely, increased cycle time and process complexity due to the additional oxygen plasma process and the required cleaning processes, resulting in an undesirable increase in cost and yield loss.

Another technique to provide smaller gate length is to trim the hard mask (also known as anti-reflective coating which is used for enhancing the imaging effect in photolithography processing) underneath the photoresist mask in addition to trimming the photoresist mask. This hard mask and photoresist mask trimming process has the same problems associated with it as the photoresist mask trimming process, namely increased cycle time and process complexity, and undesirable increase in cost and yield loss.

Another way that a smaller gate length can be formed is to over-expose the photoresist mask. One of the disadvantages associated with this technique is that it represents a significant increase in process complexity because the over-exposure process is very difficult to control. The increase in process complexity adversely increase cycle time, cost and yield loss.

One other technique to form smaller gate length is to use phase shift masks. The disadvantages associated with the phase shift mask method are complicated photolithography tool and process which often times result in increase cycle time, cost and yield loss.

As the device sizes are scaled down, the gate length, source junctions and drain junctions have to scale down. As the gate length reduces, the channel length between the source and drain is shortened. The shortening in channel length has led to several severe problems.

One of the problems associated with shortened channel length is the so-called "hot carrier effect". As the channel length is shortened, the maximum electric field $E_m$ becomes more isolated near the drain side of the channel causing a saturated condition that increases the maximum energy on the drain side of the MOS device. The high energy causes electrons in the channel region to become "hot". The electron generally becomes hot in the vicinity of the drain edge of the channel where the energy arises. Hot electrons can degrade device performance and cause breakdown of the device. Moreover, the hot electrons can overcome the potential energy barrier between the silicon substrate and the silicon dioxide layer overlying the substrate, which causes hot electrons to be injected into the gate oxide.

Problems arising from hot carrier injections into the gate oxide include generation of a gate current and generation of a positive trapped charge which can permanently increase the threshold voltage of the MOS device. These problems are manifested as an undesirable decrease in saturation current, decrease of the transconductance and a continual reduction in device performance caused by trapped charge accumulation. Thus, hot carrier effects cause unacceptable performance degradation in MOS devices built with conventional drain structures when channel lengths are short.

Reducing the maximum electric field $E_m$ in the drain side of the channel is a popular way to control the hot carrier injections. A common approach to reducing $E_m$ is to minimize the abruptness in voltage changes near the drain side of the channel. Minimizing abrupt voltage changes reduces $E_m$ strength and the harmful hot carrier effects resulting therefrom. Reducing $E_m$ occurs by replacing an abrupt drain doping profile with a more gradually varying doping profile. A more gradual doping profile distributes $E_m$ along a larger lateral distance so that the voltage drop is shared by the channel and the drain. Absent a gradual doping profile, an abrupt junction can exist where almost all of the voltage drop occurs across the channel. The smoother or more gradual the doping profile, the smaller $E_m$ is which results in lesser hot carrier injections.

To try to remedy the problems associated with hot carrier injections, alternative drain structures such as lightly doped drain (LDD) structures have been developed. LDD structures provide a doping gradient at the drain side of the channel that leads to the reduction in $E_m$. The LDD structures act as parasitic resistors to absorb some of the energy into the drain and thus reduce maximum energy in the channel region. This reduction in energy reduces the formation of hot electrons. To further minimize the formation of hot electrons, an improvement in the gradual doping profile is needed.

In most typical LDD structures of MOS devices, sources/drains are formed by two implants with dopants. One implant is self-aligned to the polysilicon gates to form shallow source/drain extension junctions or the lightly doped source/drain regions. Oxide or oxynitride spacers are then formed around the polysilicon gate. With the shallow drain extension junctions protected by the spacers, a second implant with heavier dose is self-aligned to the oxide spacers around polysilicon gates to form deep source/drain junctions. There would then be a rapid thermal anneal (RTA) for the source/drain junctions to enhance the diffusion of the dopants implanted in the deep source/drain junctions so as to optimize the device performance. The purpose of the first implant is to form a LDD at the edge near the channel. In a LDD structure, almost the entire voltage drop occurs across the lightly doped drain region. The second implant with heavier dose forms low resistance deep drain junctions, which are coupled to the LDD structures. Since the second implant is spaced from the channel by the spacers, the resulting drain junction adjacent the light doped drain region can be made deeper without impacting device operation. The increased junction depth lowers the sheet resistance and the contact resistance of the drain.

One significant problem associated with the LDD structures is the formation of parasitic capacitors. These parasitic capacitors are formed due to the diffusion of dopants from the LDD towards the channel regions underneath the polysilicon gates as a result of RTA and other heating processes in the manufacturing of the transistors. These parasitic capacitors are highly undesirable because they slow down the switching speed of the transistors. The adverse speed impact increases disproportionately with shortened channels. Basically, the parasitic capacitance due to LDD structures as a percentage of the total transistor capacitance is higher for sub-0.18 micron transistors than it is for a 0.18 micron transistor and even worse for a sub-0.13 transistor, making the adverse speed impact much more significant in smaller transistors.

The conventional approaches to reduce parasitic capacitance have been to reduce LDD implant dosage or scaling down the operating voltage. However, these approaches also degrade the performance of the transistors.

Methods to reduce gate length in MOS transistors without the problems associated with the prior art techniques, to minimize the formation of hot carriers by improving the gradual doping profile in LDD structures, and to reduce the parasitic capacitance due to LDD structures without compromising transistor performance have long been sought but have eluded those skilled in the art.

DISCLOSURE OF THE INVENTION

The present invention provides a method of manufacturing semiconductor devices with re-entrant profile sidewalls on the gates which results in reduced gate length. The reduced gate length lends itself to implantation of reduced channel lengths and reduced parasitic capacitances which act to greatly increase operating speed.

The present invention provides a method of manufacturing semiconductors having reduced polysilicon gate length without the problems associated with the prior art techniques such as photoresist mask trimming, hard mask trimming, over-exposure of the photoresist mask and phase shift masking.

The present invention provides a method of manufacturing semiconductors having reduced parasitic capacitance.

The present invention still further provides a method of manufacturing semiconductors having LDD structures spaced away from the edges of polysilicon gates by providing polysilicon gates with re-entrant sidewall profiles during the ion implantations of the LDD structures.

The present invention also provides a method of manufacturing semiconductors with LDD structures having graded doping profiles which reduces hot carrier injections.

The above and additional advantages of the present invention will become apparent to those skilled in the art from a reading of the following detailed description when taken in conjunction with the accompanying drawings.

BRIEF DESCRIPTION OF THE DRAWINGS

FIG. 2A (PRIOR ART) is the cross-section of a partially completed MOS transistor formed using the conventional LDD process;

FIG. 2B (PRIOR ART) is the cross-section of a partially completed MOS transistor formed using the conventional LDD process with photoresist mask trimming; and FIGS. 3A through 3M illustrate the sequence of process steps of a LDD process in accordance with the present invention for fabricating CMOS transistors with LDD structures in the source and drain regions.

BEST MODE FOR CARRYING OUT THE INVENTION

Figure 1C:
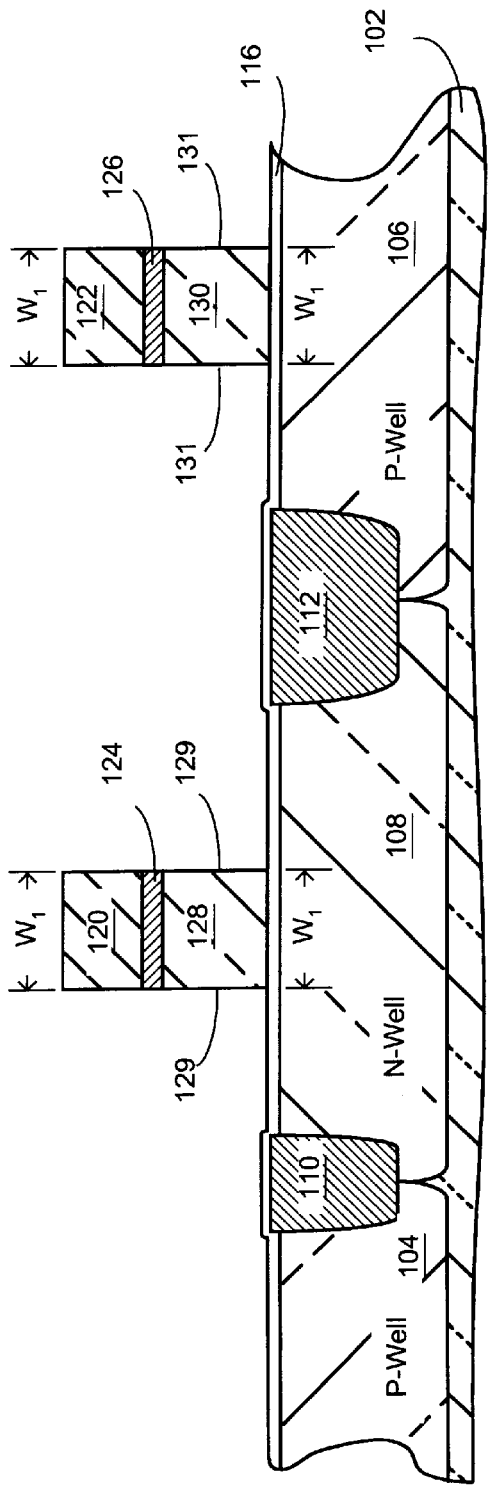
FIGS. 1A (PRIOR ART) through 1M (PRIOR ART) illustrate the sequence of process steps of a conventional LDD process for fabricating CMOS transistors with LDD structures in the source and drain regions.

FIGS. 1A (PRIOR ART) through 1M (PRIOR ART) illustrate a conventional LDD process for fabricating CMOS transistors with LDD structures in the source and drain regions.

Referring now to FIG. 1A (PRIOR ART), therein is shown a cross-section of a semiconductor 100 in an intermediate stage of processing. At this stage are shown a silicon substrate 102 with two spaced P-well regions 104 and 106, and an N-well region 108 formed thereon. The P-well regions 104 and 106 have been doped with a P-type dopant which is one of the Group III elements, such as boron and gallium, with boron (B) or boron difluoride (BF2) being the most commonly used. The N-well region 108 has been doped with an N-type dopant which is one of the Group V elements, such as phosphorus, arsenic, and antimony, with phosphorous being the most commonly used. An ESD resistor will be formed on the P-well region 104. An N-channel device and a P-channel device will be formed on the P-well region 106 and N-well region 108 respectively. Shallow trench isolation (STI) 110 is formed between the P-well region 104 and the N-well region 108, and the STI 112 is formed between the N-well region 108 and the P-well region 106. STI 110 electrically isolates devices to be formed on the P-well region 104 and N-well region 108. Similarly, STI 112 electrically isolates devices to be formed on the P-well region 106 and the N-well region 108. The materials that have been used for STI have included various oxides. On top of the silicon substrate 102 is a polysilicon layer 114 and a layer of gate oxide 1 16 disposed between the silicon substrate 102 and the polysilicon layer 114. On top of the polysilicon layer is a first mask layer 118. The first mask layer 118 is typically an anti-reflective coating (ARC) for enhancing the imaging effect in subsequent photolithography processing. The materials that have been used for ARC have included various oxides and nitrides. One of the most commonly used ARC is silicon oxynitride. On top of the ARC 118 are patterned second masks (photoresist masks) 120 and 122 which are typically a photoresist material. The photoresist masks 120 and 122 are conventionally formed by patterning and etching a photoresist mask layer (not shown). The second masks 120 and 122 have lengths of $W_1$. which are the smallest gate lengths current lithography light sources can provide.

It should noted that the term "region" is used herein and applies to areas after or subject to implantation since there is a tapering decrease or increase of atoms of a given dopant in the region designated rather than sharp demarcations as apparently indicated by the lines shown.

Referring now to FIG. 1B (PRIOR ART), therein is shown the silicon substrate 102 after the conventional step of ARC etch to form patterned ARC masks 124 and 126, respectively.

Referring now to FIG. 1C (PRIOR ART), therein is shown the silicon substrate 102 after the conventional step of polysilicon gate etch (an anisotropic etch) which forms two spaced polysilicon gates 128 and 130. The polysilicon gates 128 and 130 have gate length of $W_1$ because they replicate the dimensions of the photoresist masks 120 and 122. Each of the polysilicon gates 128 and 130 has sidewalls 129 and 131 respectively. Each of the sidewalls 129 and 131 has a substantially vertical profile, i.e., the lengths of the top and bottom portions of the polysilicon gates 128 and 130 are substantially identical.

Figure 1D:
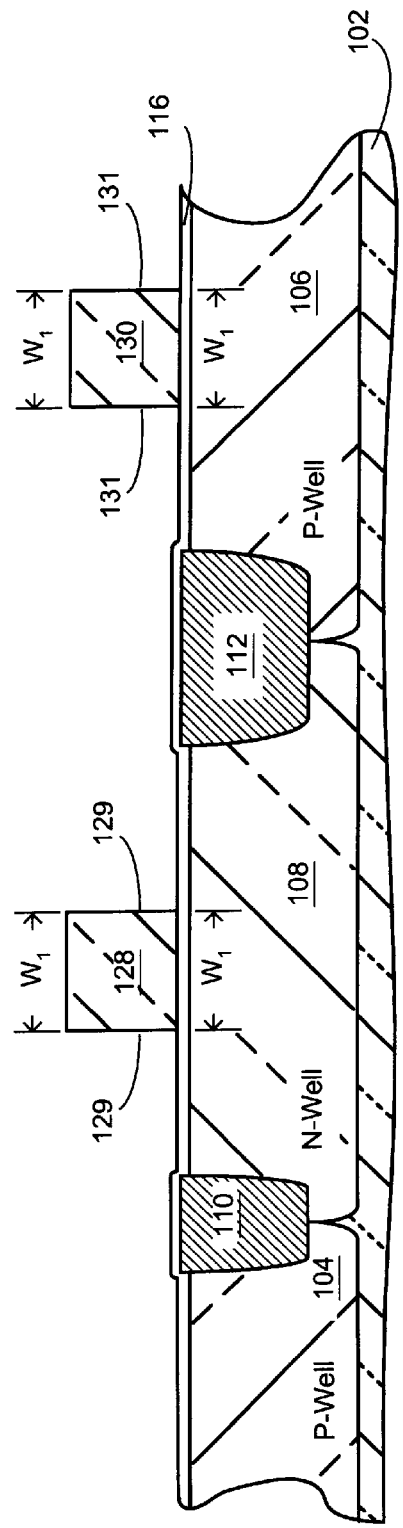

Referring now to FIG. 1D (PRIOR ART), therein is shown the silicon substrate 102 after the conventional steps of photoresist stripping and ARC removal.

Referring now to FIG. 1E (PRIOR ART), therein is shown the ion implantation 132 of a P-type dopant through the thin gate oxide 116 to form the P-type doped, LDD regions or shallow source and drain extension junctions 134 and 136. The ion implantation 132 is a low energy, low concentration P-implant using, for example, $B_{11}$. It should be noted that "source" and "drain" may be used interchangeably since they are the same for all purposes until connected in a circuit. A conventional photolithographic masking process using a patterned photoresist 138 (a P-LDD mask) is used to prevent ion implantation 132 of the P-well regions 104 and 106.

Referring now to FIG. 1F (PRIOR ART), therein is shown the removal of photoresist 138.

Referring now to FIG. 1G (PRIOR ART), therein is shown the ion implantation 140 of an N-type dopant through the thin gate oxide 116 to form the N-type doped, LDD regions or shallow source and drain extension junctions 142 and 144. The ion implantation 140 is a low energy, low concentration N-implant using, for example, phosphorous. Again, a conventional photolithographic masking process using a photoresist 146 (an N-LDD mask) is used to prevent ion implantation 140 of the P-well region 104 and N-well region 108. Referring now to FIG. 1H (PRIOR ART), therein is shown the removal of photoresist 146.

Referring now to FIG. 1I (PRIOR ART), therein is shown sidewall spacers 148 and 150 formed around the polysilicon gates 128 and 130, respectively. The sidewall spacers 148 and 150 can be formed using conventional techniques such as by depositing a spacer film over the gate oxide layer 116 and the polysilicon gates 128 and 130, and then anisotropically etching the spacer film. At this stage, except for the gate oxides 152 and 154 which are located directly underneath the polysilicon gates 128 and 130 and sidewall spacers 148 and 150, gate oxides in other areas of the substrate 102 have been removed.

Referring now to FIG. 1J (PRIOR ART), therein is shown the ion implantation 156 of a P-type dopant to form the P-type doped, deep source and drain junctions 158 and 160. The ion implantation 156 is a high energy, high concentration P+ implant using, for example, $BF_2$. The sidewall spacer 148 shields the shallow source and drain extension junction 134 and 136 from ion implantation 156. Again, a conventional photolithographic masking process using a photoresist 162 (a P+ S/D mask) is used to prevent ion implantation 156 of the P-well regions 104 and 106.

Figure 1K:
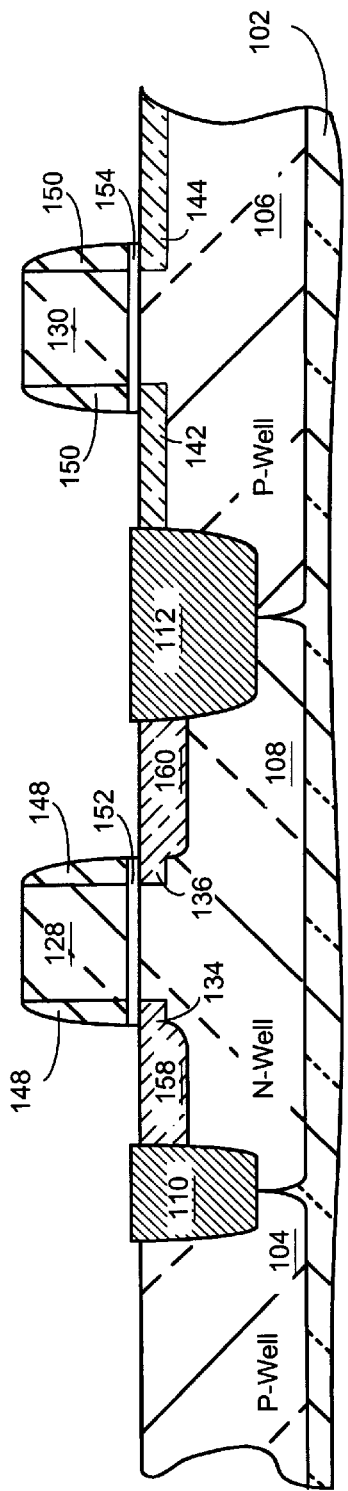

Referring now to FIG. 1K (PRIOR ART), therein is shown the removal of photoresist 162.

Figure 1L:
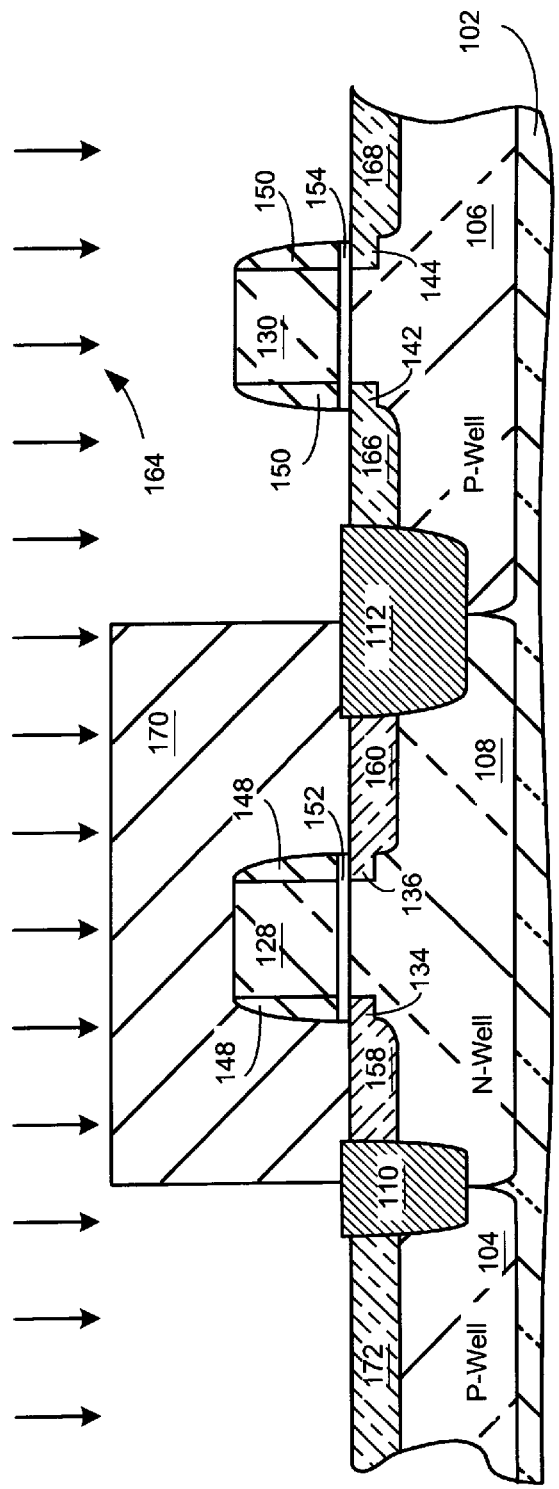

Referring now to FIG. 1L (PRIOR ART), therein is shown the ion implantation 164 of an N-type dopant to form the N-type doped, deep source and drain junctions 166 and 168. The ion implantation 164 is a high energy, high concentration N+ implant using, for example, phosphorous. The sidewall spacer 150 shields the shallow source and drain extension junctions 142 and 144 from ion implantation 164. The ion implantation 164 also forms an N-type doped, resistor region 172 in the P-well region 104. Again, a conventional photolithographic masking process using a photoresist 170 (an N+ S/D mask) is used to prevent ion implantation 164 of the N-well regions 108.

Referring now to FIG. 1M (PRIOR ART), therein is shown the rapid thermal anneal (RTA) of the N-type doped, resistor region 172, the P-type doped, shallow source and drain extension junctions 134 and 136, the P-type doped, deep source and drain junctions 158 and 160, the N-typed doped, shallow source and drain extension junctions 142 and 144, the N-type doped, deep source and drain junctions 166 and 168. The transient enhanced diffusion caused by the RTA inherently increases the displacement of the P-type doped, shallow source and drain extension junctions 134 and 136 and the N-type doped, shallow source and drain extension junctions 142 and 144 into their respective channel region. The P-type doped, shallow source and drain extension junctions 134 and 136, and the N-typed doped, shallow source and drain extension junctions 142 and 144 provide the resistance needed to suppress hot electrons. However, the overlap portions between the P-type doped, shallow source junction extension 134 (136), the gate oxide 152, and the polysilicon gate 128 form a parasitic capacitor. Similarly, the overlap portions between the N-type doped, shallow source junction extension 142 (144), the gate oxide 154, and the polysilicon gate 130 form another parasitic capacitor. The more the overlap, the higher is the capacitance of the parasitic capacitor. As explained in the Background Art, parasitic capacitors are highly undesirable because they slow down the switching speed of the transistor. The adverse speed impact increases disproportionately with shortened channels. Thus, the adverse speed impact becomes significantly worse for devices with reduced gate length by using prior art techniques such as photoresist mask trimming, hard mask trimming (in addition to photoresist mask trimming), over-exposure of photoresist mask, or phase shift masks. Accordingly, it is desirable to reduce the overlap portions.

In addition to the problems associated with parasitic capacitance due to the lateral diffusion of the LDD structures, it is also desirable to improve the gradual doping profile of the LDD structures to further minimize the formation of hot carrier injections.

Referring now to FIG. 2A (PRIOR ART), therein is shown a cross-section of the semiconductor 100 in an intermediate stage of processing. For convenience of illustration, like reference numerals are used in FIG. 2A (PRIOR ART) to denote like elements already described in FIG. 1A (PRIOR ART) through 1M (PRIOR ART). FIG. 2A (PRIOR ART) is similar to what was shown in FIG. 1M (PRIOR ART) except that for clarity, only the P-channel device portion of the semiconductor 100 is shown. Polysilicon gate 128 has a gate length of $W_1$. which is assumed to be the smallest gate length current lithography light sources can provide. As explained earlier in FIG. 1M, the overlap portions $(X_1)$ between the P-type doped, shallow source junction extension 134, the gate oxide 152, and the polysilicon gate 128 form a parasitic capacitor. Similarly, the overlap portions $(X_2)$ between the P-type doped, shallow source junction extension 136, the gate oxide 152, and the polysilicon gate 128 form another parasitic capacitor.

Referring now to FIG. 2B (PRIOR ART), therein is shown a cross-section of a semiconductor 200 in an intermediate stage of processing. At this stage is shown the semiconductor 200 after the ion implantation of dopants to form the P-typed doped, shallow source and drain extensions 234 and 236, the formation of spacer 248 around polysilicon gate 228, the ion implantation of dopants to form the P-type doped, deep source and drain junctions 258 and 260 and the RTA similar to what were shown in FIG. 1A (PRIOR ART) through IM (PRIOR ART). FIG. 2B (PRIOR ART) differs from FIG. 2A (PRIOR ART) in that the gate length of polysilicon gate 228 has a length of $W_2$ which is smaller than the length $W_1$. of polysilicon gate 128 as shown in FIG. 2A (PRIOR ART). The reduction in polysilicon gate length is done by using a conventional photoresist mask trimming technique, such as isotropic etching, to reduce the dimensions of the photoresist mask prior to the conventional step of polysilicon gate etch (FIG. 1C (PRIOR ART)) which forms the polysilicon gate 228. Photoresist mask trimming is done to provide polysilicon gates that have gate lengths ($W_2$) smaller than what is possible with the current photolithographic technology alone. For example, the current photolithographic technology can provide a polysilicon gate with a width of down to about 260 nm. With the use of photoresist mask trimming technique, the resulting polysilicon gate can have a length of down to about 180 mn. A transistor with narrower gate width is highly desirable because it has a higher switching speed.

Again, the transient enhanced diffusion caused by the RTA inherently increases the displacement of the shallow source and drain extension junctions 234 and 236 into the channel region. The shallow source and drain extension junctions 234 and 236 provide the resistance needed to suppress hot electrons. However, the overlap portions ($X_3$) between the shallow source junction extension 234, the gate oxide 252, and the polysilicon gate 228 form a parasitic capacitor. Similarly, the overlap portions ($X_4$) between the shallow source junction extension 236, the gate oxide 252, and the polysilicon gate 228 form another parasitic capacitor. Overlap portions $X_3$, $X_4$ in FIG. 2B and $X_1$, $X_2$ in FIG.2A are approximately equal. However, the ratio of $X_3$ (or $X_4$) to length $W_2$ of the polysilicon gate 228 (FIG. 2B) is much higher than the ratio of $X_1$, (or $X_2$) to length $W_1$. of the polysilicon gate 128 (FIG. 2A (PRIOR ART)) because $W_2$ is much smaller than $W_1$. Thus the parasitic capacitance due to the overlap portions $X_3$ or $X_4$ as a percentage of the total transistor capacitance becomes much more significant when the gate width reduces. Accordingly, the parasitic capacitance due to overlap portions $X_3$ and $X_4$ has a more significant impact to the overall capacitance of the transistor which results in a more severe speed penalty. Therefore, while the prior art technique for providing smaller gate length, such as the photoresist mask trimming, can provide a transistor with further reduction in polysilicon gate length, the parasitic capacitance becomes increasingly worse. This problem of increased parasitic capacitance is found in other conventional techniques for providing smaller gate length, such as hard mask trimming, over-exposure of the photoresist mask, and phase shift masking.

The present invention provide methods to reduce gate length without the problems associated with the prior art techniques, to minimize the formation of hot carriers by improving the gradual doping profile in LDD structures, and to reduce the parasitic capacitance due to LDD structures without compromising transistor performance.

FIGS. 3A through 3M illustrate the sequence of process steps of a LDD process in accordance with the present invention for fabricating CMOS transistors with LDD structures in the source and drain regions.

Figure 3A:
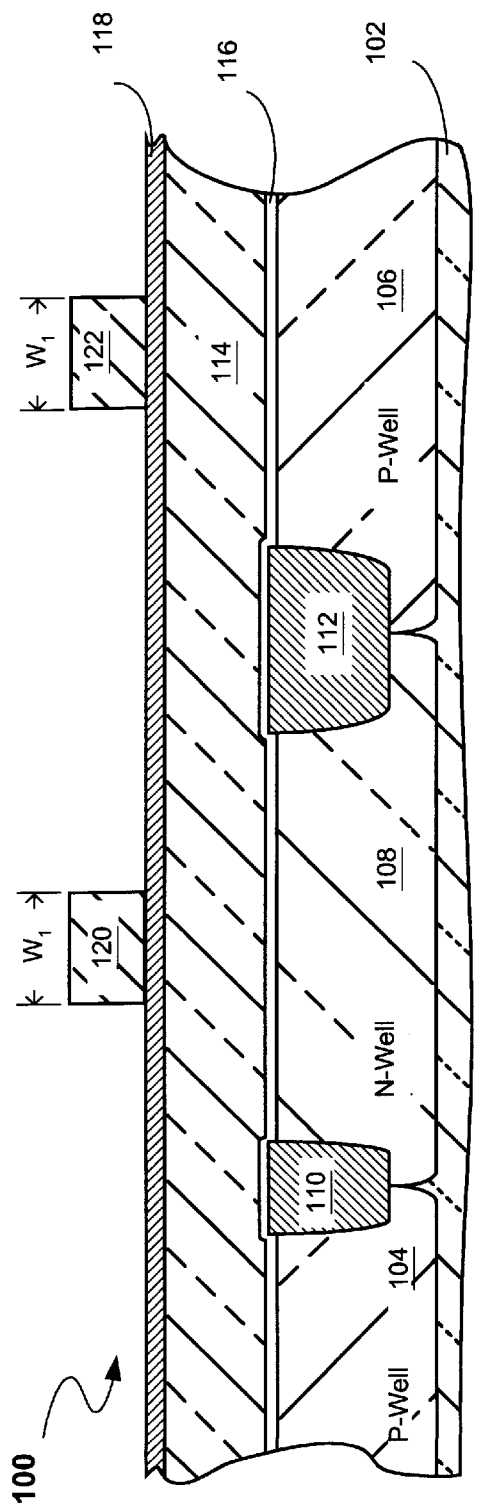

Referring now to FIG. 3A, therein is shown a cross-section of a semiconductor 100 in an intermediate stage of processing. For convenience of illustration, like reference numerals are used in FIG. 3A through 3M to denote like elements already described in FIG. 1A (PRIOR ART) through IM (PRIOR ART) and FIG. 2A (PRIOR ART) through 2B (PRIOR ART). FIG. 3A is identical to what was shown in FIG. 1A (PRIOR ART). At this stage are shown a silicon substrate 102 with two spaced P-well regions 104 and 106, and an N-well region 108 formed thereon. Again, the photoresist masks 120 and 122 have lengths equal $W_1$. which is the smallest dimension current lithography light sources can provide.

Figure 3B:
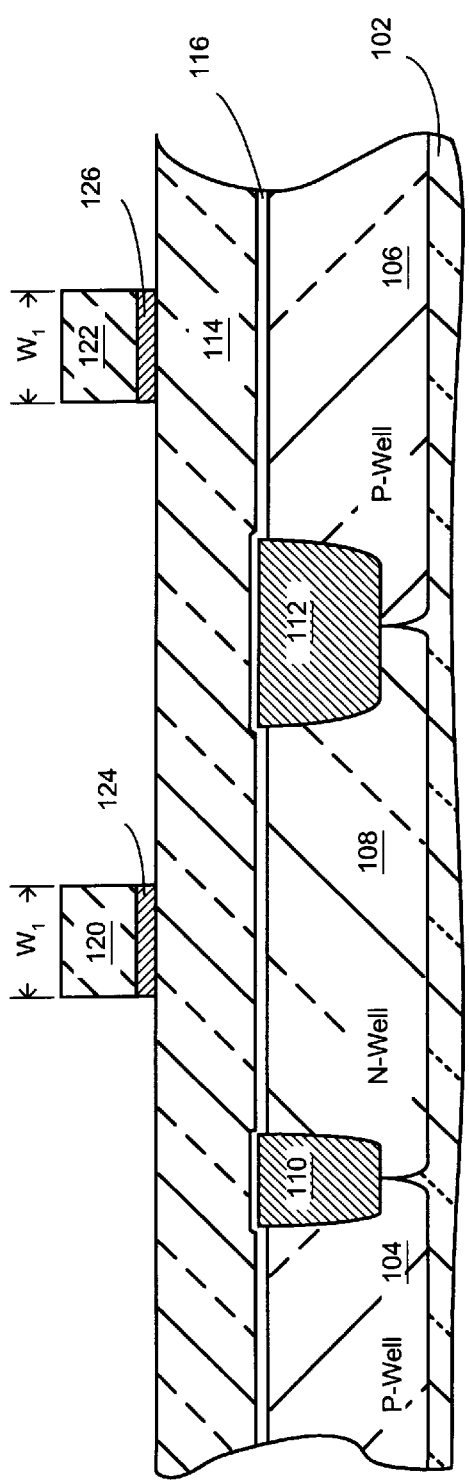

Referring now to FIG. 3B, therein is shown the silicon substrate 102 after the conventional step of ARC etch to form patterned ARC mask 124 and 126 similar to what was shown in FIG. 1B (PRIOR ART).

Figure 3C:
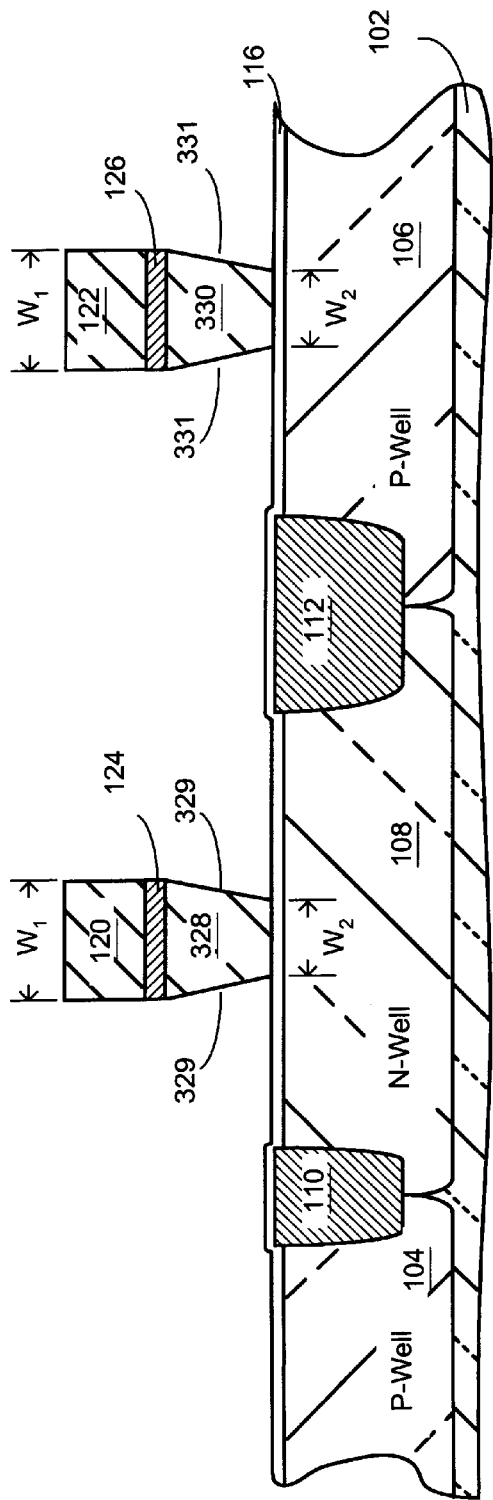

Referring now to FIG. 3C, therein is shown the silicon substrate 102 after the step of polysilicon gate etch which forms two spaced polysilicon gates 328 and 330 in accordance with the present invention. The polysilicon gates 328 and 330 have sidewalls 329 and 331 respectively. Sidewalls 329 and 331 have re-entrant profiles, i.e., the slope of the sidewalls 329 and 331 are greater than 90 degree to the horizontal axis. Specifically, the top portion of the polysilicon gate 328 (or 330) has a length of $W_1$. while the bottom portion of the polysilicon gate 328 (or 330) has a length of $W_2$, where $W_2$ is smaller than $W_1$. $W_1$I is the smaller gate length current lithography light sources can provide (FIG. 2A (PRIOR ART)) and $W_2$ is the gate length achievable by using the prior art technique such as photoresist mask trimming (FIG. 2B (PRIOR ART)). The re-entrant profiles can be achieved by controlling one or more of the polysilicon gate etching parameters, such as the concentrations of etchants (such as the amount of HBr which is a main polymer building agent for polysilicon gate etch), temperature used during the etching process, radio frequency (RF) power, direct current (D.C.) bias, magnetic field strength. For example, when a higher temperature is used during polysilicon gate etch, there is less polymer formed on the sidewalls of the polysilicon gates. Less polymer formed on the sidewalls reduces the protection of the sidewalls. Therefore, more chemical reactions will take place on the sidewalls which will undercut the sidewalls to form re-entrant profiles.

Since the length $W_2$ is a function of $W_1$, those skilled in the art would understand that $W_1$. can be made smaller by use of conventional oxygen plasma trimming techniques which, in turn, would make $W_2$ shorter.

Figure 3D:
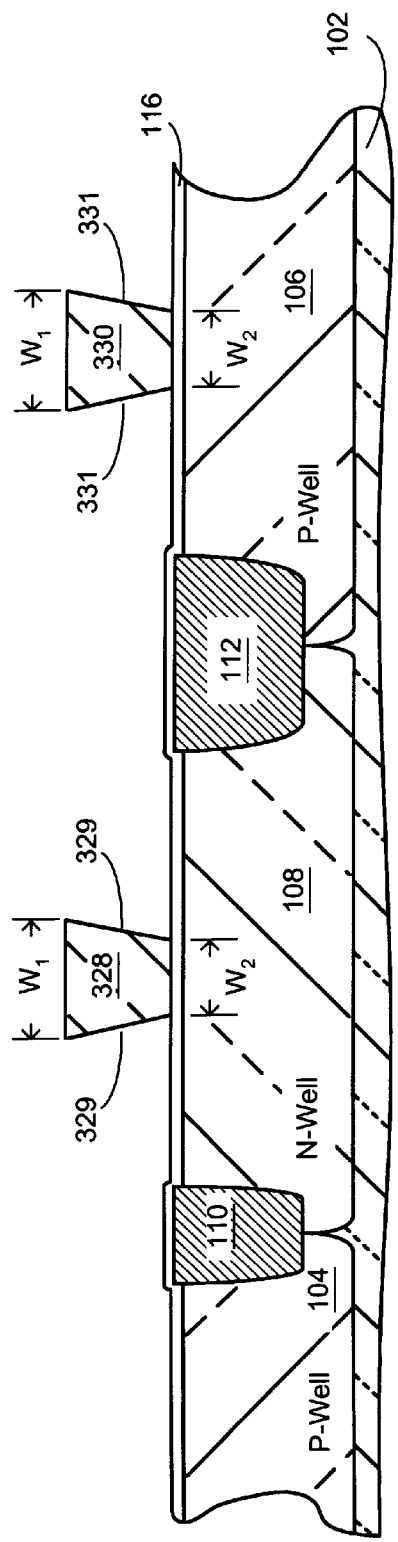

Referring now to FIG. 3D, therein is shown the silicon substrate 102 after the removal of the photoresist masks 120 and 122 using the conventional steps of photoresist stripping.

Figure 3E:
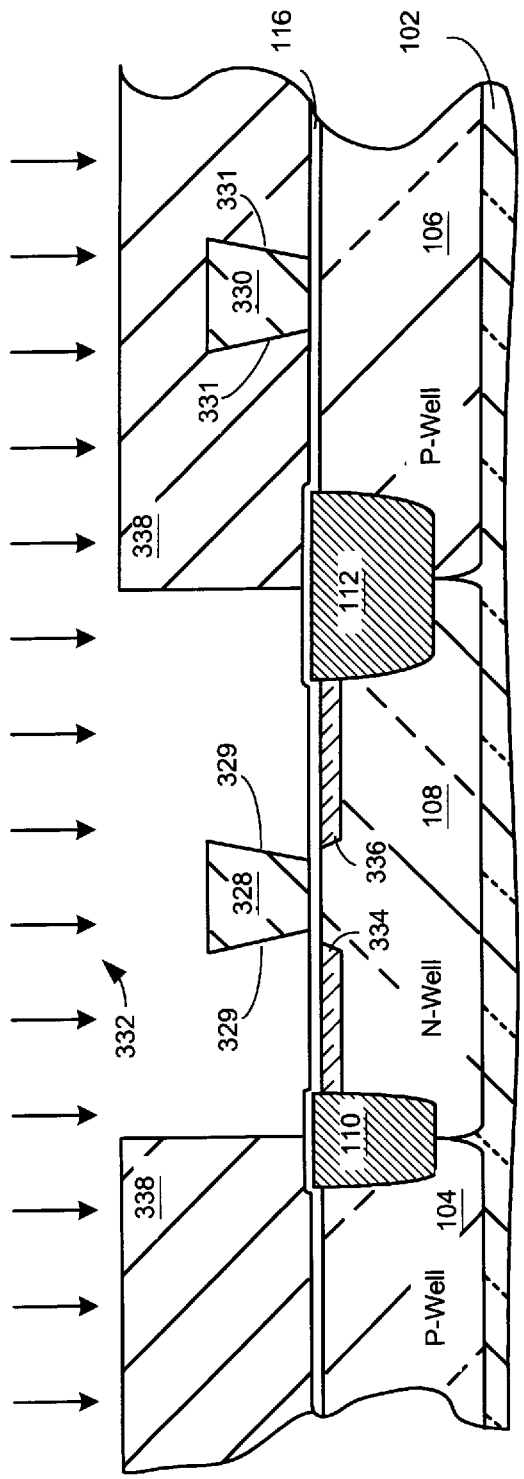

Referring now to FIG. 3E, therein is shown the ion implantation 332 of a dopant at a first energy and a first concentration through the thin gate oxide 116 to form the P-type doped, shallow source and drain extension junctions 334 and 336. The shallow source and drain extension junctions 334 and 336 are formed under the influence of the re-entrant profiles of sidewalls 329, resulting in junctions with graded doping profiles. The junction dopant concentrations at any point laterally along the shallow source and drain extension junctions 334 and 336 are inversely proportional to the thickness of the overlying polysilicon gate 328.

Due to the graded doping profiles, shallow extension junctions 334 and 336 have an improved gradual doping profile which minimize $E_m$. When $E_m$ is minimized, the hot electron injections will be reduced. In addition, the shallow source and drain extension junctions 334 and 336 are at a distance away from the edges of the bottom portion of the polysilicon gate 328 (or from the portion of silicon substrate (N-well 108) under the bottom portion of the polysilicon gate 328). By controlling the re-entrant profiles of the sidewalls 329 of polysilicon gates 328, the implantation energy, the dopant concentration, or a combination thereof, the distance can be adjusted to minimize the lateral diffusion of the shallow source and drain extension junctions 334 and 336 into the channel region due to subsequent RTA. A conventional photolithographic masking process using a photoresist 338 (a P-LDD mask) is used to prevent ion implantation 332 of the P-well regions 104 and 106.

It should also be understood that as an alternate mode, the re-entrant profiles 329 could be controlled and used either by themselves or with sidewall spacers to permit graduated implantation which would provide the equivalent of shallow and deep source and drain junctions with one implantation.

Figure 3F:
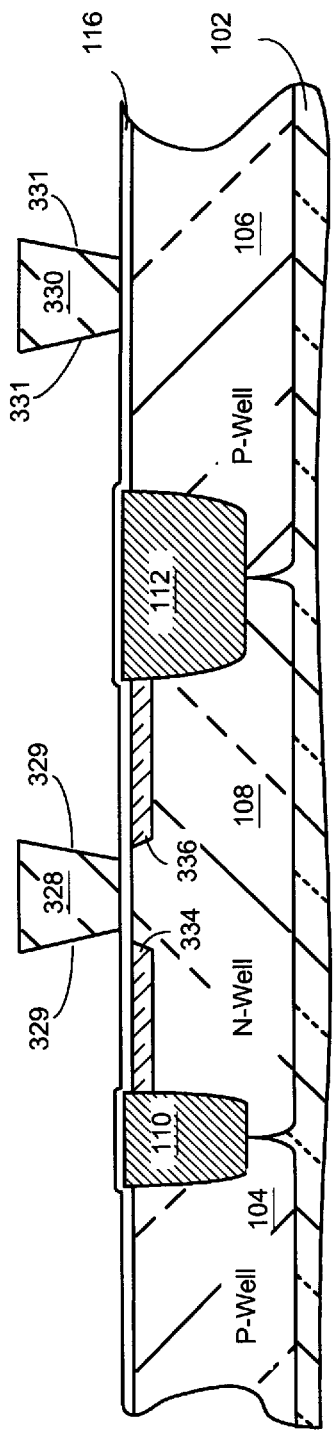

Referring now to FIG. 3F, therein is shown the removal of the photoresist 338.

Referring now to FIG. 3G, therein is shown the ion implantation 340 of a dopant at a second energy and a second concentration through the thin gate oxide 116 to form the N-type doped, shallow source and drain extension junctions 342 and 344. Again, the shallow source and drain extension junctions 342 and 344 are formed under the influence of the re-entrant profile of sidewalls 331 resulting in junctions with graded and therefore improved doping profiles which minimize $E_m$. When $E_m$ is minimized, the hot electron injections will be reduced. Similarly, the shallow source and drain extension junctions 342 and 344 are formed at a distance away from the edges of the bottom portion of the polysilicon gate 330 (or from the silicon substrate (N-well 108) portion under the bottom portion of polysilicon gate 330). Again, by controlling the re-entrant profiles of the sidewalls 331 of polysilicon gates 330, the implantation energy, the dopant concentration, or a combination thereof, the distance can be adjusted to be minimize the lateral diffusion of the shallow source and drain extension junctions into the channel region due to subsequent RTA. A conventional photolithographic masking process using a photoresist 346 (an N-LDD mask) is used to prevent ion implantation 340 of the P-well region 104 and the N-well region 108.

Referring now to FIG. 3H, therein is shown the removal of photoresist 346.

Figure 3I:
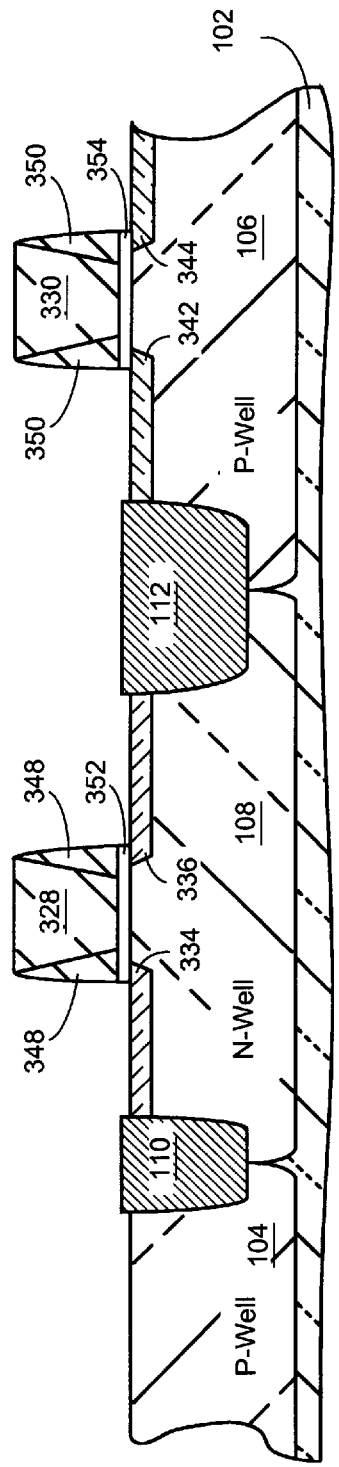

Referring now to FIG. 3I, therein is shown sidewall spacers 348 and 350 formed around the polysilicon gates 328 and 330 similar to what was shown in FIG. 1I. At this stage, except for the gate oxides 352 and 354 which are located directly underneath the polysilicon gates 328 and 330 and sidewall spacers 348 and 350, gate oxides in other areas of the silicon substrate 102 have been removed.

Figure 3J:
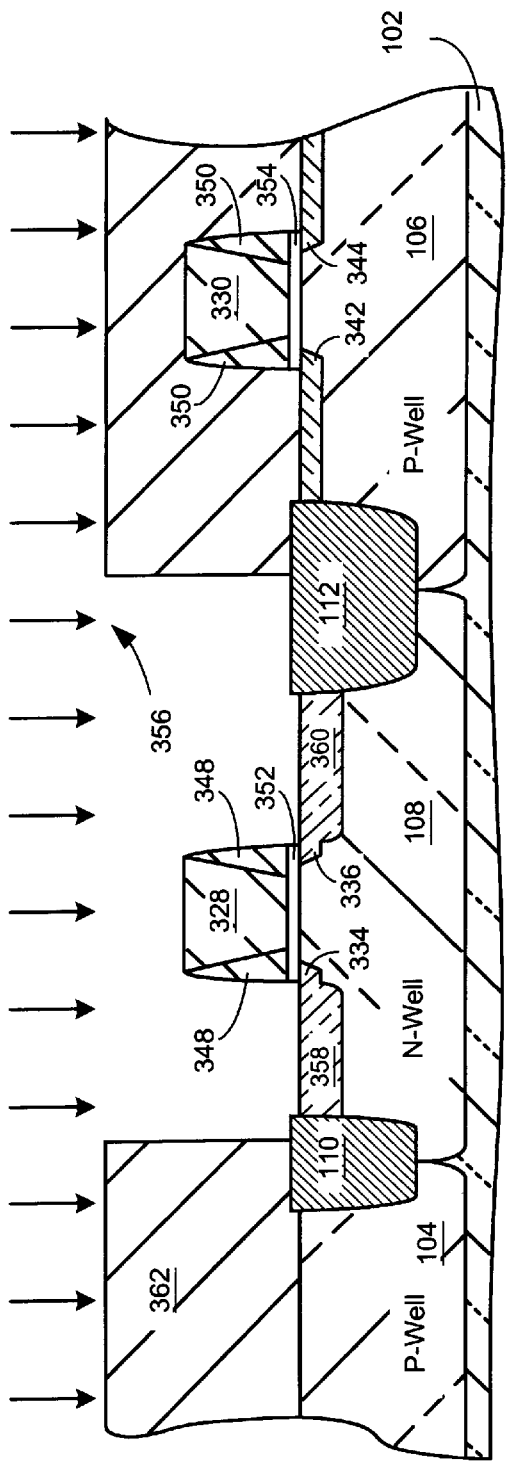

Referring now to FIG. 3J, therein is shown the ion implantation 356 of a P-type dopant to form the P-type doped, deep source and drain junctions 358 and 360 similar to what was shown in FIG. 1J. The sidewall spacer 348 shields the shallow source and drain extension junction 334 and 336 from ion implantation 356. Again, a conventional photolithographic masking process using a photoresist 362 (a P+ S/D mask) is used to prevent ion implantation 356 of the P-well regions 104 and 106.

Figure 3K:
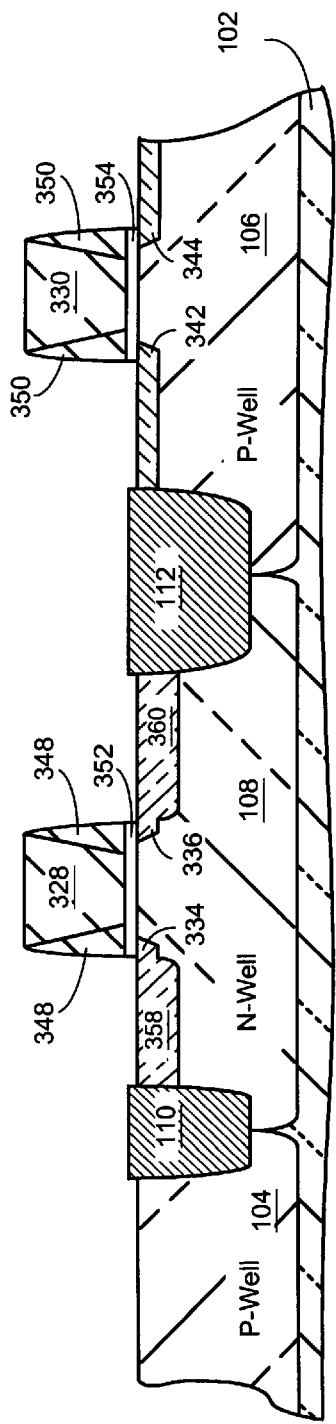

Referring now to FIG. 3K, therein is shown the removal of photoresist 362.

Figure 3L:
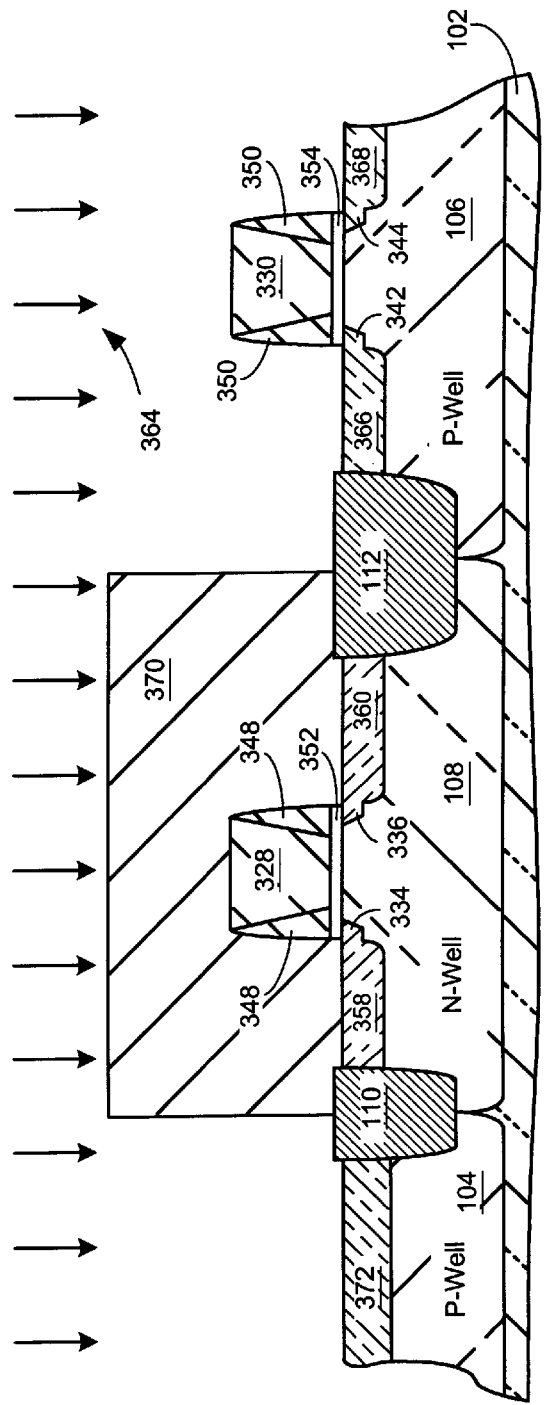

Referring now to FIG. 3L, therein is shown the ion implantation 364 of an N-type dopant to form the N-type doped, deep source and drain junctions 366 and 368. The sidewall spacer 350 shields the shallow source and drain extension junctions 342 and 344 from ion implantation 364. The ion implantation 364 also forms an N-type doped, resistor region 372 in the P-well region 104. Again, a conventional photolithographic masking process using a photoresist 370 (an N+ S/D mask) is used to prevent ion implantation 364 of the N-well regions 108.

Figure 3M:
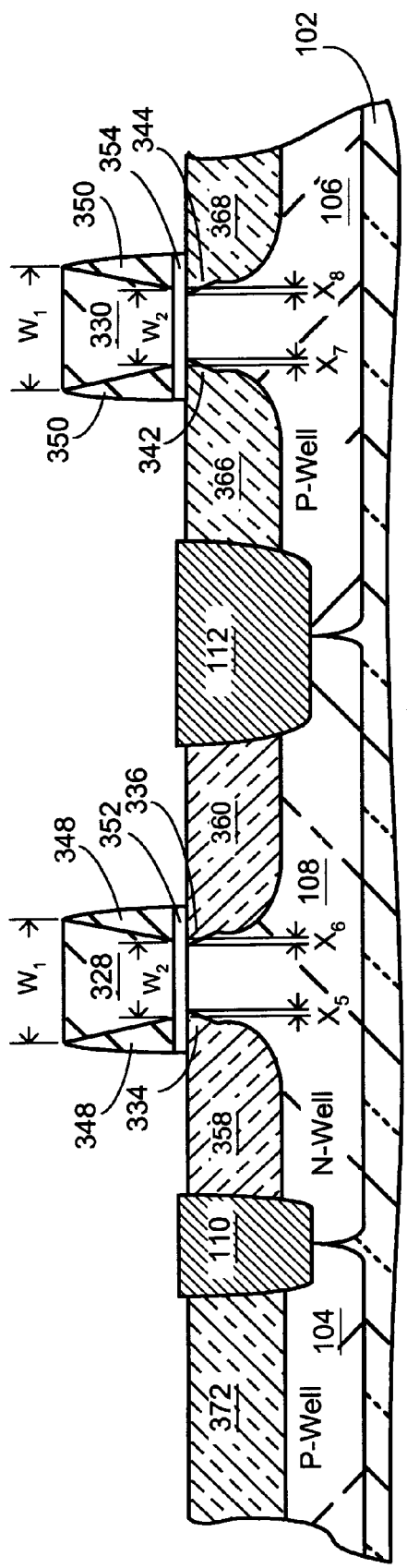

Referring now to FIG. 3M, therein is shown the RTA of the N-type doped, resistor region 372, the P-type doped, shallow source and drain extension junctions 334 and 336, the P-type doped, deep source and drain junctions 358 and 360, the N-typed doped, shallow source and drain extension junctions 342 and 344, the N-type doped, deep source and drain junctions 366 and 368 after the removal of photoresist 370. Again, the transient enhanced diffusion caused by the RTA inherently increases the displacement of the P-type doped, shallow source and drain extension junctions 334 and 336, and N-type doped, shallow source and drain extension junctions 342 and 344 into the channel region. As mentioned early, the overlap portions, $X_5$ and $X_6$ ($X_7$ and $X_8$) between the shallow source/drain extension junctions 334 and 336 (342 and 344), the gate oxide 152 (154), and the polysilicon gate 328 (330) form parasitic capacitors. However, unlike the conventional LDD process that uses photoresist mask trimming to provide a polysilicon gate length of $W_2$ (as shown in FIG. 2B), here the overlap portions, $X_5$ and $X_6$ (or $X_7$ and $X_8$), are reduced to less than $X_3$ and $X_4$ since the shallow source/drain extension junctions 334 and 336 (342 and 344) were spaced away from the edges of the bottom portion of the polysilicon gate 328 (or 330) by a distance prior to the RTA. Thus the lateral diffusions of the shallow source and drain extension junctions into the channel regions decrease. Accordingly, with the present invention, the length of the bottom portion of the polysilicon gate 328 (or 330) can be reduced to $W_2$ (the same as shown in FIG. 2B) without an increase in the resultant parasitic capacitance. The resultant parasitic capacitance with the present invention is less than what is achievable using the prior art techniques for reducing polysilicon gate length, such as photoresist mask trimming.

Thus, in accordance with this embodiment of the present invention, CMOS devices with LDD structures in the source and drain regions of the transistors can be formed with reduced gate lengths beyond what is achievable by using the current photolithograhy light sources without the problems associated with the prior art techniques such as photoresist mask trimming, hard mask trimming, over-exposure of the resist mask and phase shift masking. In addition, graded shallow extension junctions are formed with reduced parasitic capacitance and improved gradual doping profiles that minimize hot carrier injections without compromising transistor performance.

In production of the present invention, a conventional process is used to provide a silicon substrate 102 with two spaced P-well regions 104 and 106, and an N-well region 108 formed thereon (FIG. 3A). The P-well regions 104 and 106 have been doped with a P-type dopant which is one of the Group III elements such as boron difluoride ($BF_2$). The N-well region 108 has been doped with an N-type dopant which is one of the Group V elements such as phosphorus. Shallow trench isolations (STI) 110 and 112 are conventional formed between the P-well region 104 and the N-well region 108, and the P-well region 106 and N-well region 108 respectively. On top of the polysilicon layer is a first mask layer 118. The first mask layer 118 is an anti-reflective coating (ARC), which is typically a silicon oxynitride layer, for enhancing the imaging effect in subsequent photolithography processing. On top of the ARC 118 are patterned photoresist masks 120 and 122. The photoresist masks 120 and 122 are conventionally formed by patterning and etching a photoresist mask layer (not shown).

Next, a conventional step of ARC etch is used to form patterned ARC mask 124 and 126.

The next step is a polysilicon gate etch which forms two spaced polysilicon gates 328 and 330 in accordance with the present invention (FIG. 3C). The polysilicon gates 328 and 330 have sidewalls 329 and 331, respectively. Sidewalls 329 and 331 have re-entran profiles. The re-entrant profiles can be achieved by controlling one or more of the polysilicon gate etching parameters, such as the concentrations of etchants (such as the amount of HBr which is a main polymer building agent for polysilicon gate etch), temperature during the etching process, radio frequency (RF) power, direct current (D.C.) bias, magnetic field strength, as would be evident to those having ordinary skill in this art. For example, when a higher temperature is used during polysilicon gate etch, there is less polymer formed on the sidewalls of the polysilicon gate which allows more chemical reactions to undercut the sidewalls to form the desired re-entrant profiles. It should be noted that the dimensions ($W_2$) of the bottom portions of the polysilicon gate 328 and 330 are the critical dimensions of the resulting transistors. Therefore, even though the dimensions (We) of the top portion of the polysilicon gates 328 and 330 remain at a higher value, smaller $W_2$ will provide higher performance transistors.

Thereafter, a conventional step of photoresist stripping is used to remove the photoresist masks 320 and 322.

The next step is the ion implantation 332 of a P-type dopant through the thin gate oxide 116 to form the P-type doped, shallow source and drain extension junctions 334 and 336. The P-type doped, shallow source and drain extension junctions 334 and 336 are formed under the influence of the re-entrant profile of sidewalls 329, resulting in junctions with graded doping profiles. The junction dopant concentrations at any point laterally along the shallow source and drain extension junctions 334 and 336 are inversely proportional to the thickness of the overlying polysilicon gate 328. The shallow extension junctions 334 and 336 have an improved gradual doping profile which minimize En. When $E_m$ is minimized, hot electron injections will be reduced. Further, the shallow source and drain extension junctions 334 and 336 are at a distance away from the edges of the bottom portion of the polysilicon gate 328. The distance can be adjusted to minimize the lateral diffusion of the shallow source and drain extension junctions 334 and 336 into the channel region due to subsequent RTA by controlling the re-entrant profiles of the sidewalls 329 of polysilicon gates 328, the implantation energy, the dopant concentration, or a combination thereof. A conventional photolithographic masking process using a photoresist 338 (a P-LDD mask) is used to prevent ion implantation 332 of the P-well regions 104 and 106. After the ion implantation of the P-type dopant, the photoresist 342 is removed.

The next step is another ion implantation 340 of an N-type dopant through the thin gate oxide 116 to form the N-type doped, shallow source and drain extension junctions 342 and 344. Again, the N-type doped, shallow source and drain extension junctions 342 and 344 are formed under the influence of the re-entrant profile of sidewalls 331 resulting in junctions with graded and therefore improved doping profiles which minimize $E_m$. Similarly, the shallow source and drain extension junctions 342 and 344 are at a distance away from the edges of the bottom portion of the polysilicon gate 330. A conventional photolithographic masking process using a photoresist 346 (an N-LDD mask) is used to prevent ion implantation 344 of the N-well region 108.

The photoresist 346 is then removed.

Thereafter, sidewall spacers 348 and 350 are formed around the polysilicon gates 328 and 330. The sidewall spacers 348 and 350 can be formed using conventional techniques such as by depositing a spacer film over the gate oxide layer 116 and the polysilicon gates 328 and 330, and then anisotropically etching the spacer film.

The next step is the ion implantation 356 of a P-type dopant to form the P-type doped, deep source and drain junctions 358 and 360 (FIG. 3J). The ion implantation 356 is a high energy, high concentration P+implant using, for example, $BF_2$. The sidewall spacer 348 shields the shallow source and drain extension junction 334 and 336 from ion implantation 356. A conventional photolithographic masking process using a photoresist 362 (a P+S/D mask) is used to prevent ion implantation 356 of the P-well regions 104 and 106.

Thereafter, photoresist 362 is removed.

The next step is the ion implantation 364 of an N-type dopant through the sidewall spacer 350 to form the N-type doped, deep source and drain junctions 366 and 368. The ion implantation 364 is a high energy, high concentration N+ implant using, for example, phosphorus. The sidewall spacer 350 shields the shallow source and drain extension junctions 342 and 344 from ion implantation 364. The ion implantation 340 also forms an N-type doped, resistor region 372 in the P-well region 104. Again, a conventional photolithographic masking process using a photoresist 370 (an N+ S/D mask) is used to prevent ion implantation 364 of the N-well regions 104.

The photoresist 370 is then removed, followed by the RTA of the N-type doped, resistor region 372, the P-type doped, shallow source and drain extension junctions 334 and 336, the P-type doped, deep source and drain junctions 358 and 360, the N-typed doped, shallow source and drain extension junctions 342 and 344, the N-type doped, deep source and drain junctions 366 and 368. Again, the transient enhanced diffusion caused by the RTA inherently increases the displacement of the P-type doped, shallow source and drain extension junctions 334 and 336, and N-type doped, shallow source and drain extension junctions 342 and 344 into the channel region. The overlap portions between the shallow source/drain extension junctions 334 and 336 (342 and 344), the gate oxide 152 (154), and the polysilicon gate 328 (330) to form parasitic capacitors. However, unlike the conventional LDD process, the overlap portions are reduced since the shallow source/drain extension junctions 334 and 336 (342 and 344) were spaced away from the edges of the bottom portion of the polysilicon gate 328 (330) by a distance prior to the RTA. Thus the lateral diffusions of the shallow source and drain extension junctions into the channel regions decreases. Accordingly, the resultant parasitic capacitance are reduced.

The semiconductor 200 is now ready for further processing.

Thus, in accordance with this embodiment of the present invention, CMOS devices with LDD structures in the source and drain regions of the transistors can be formed with reduced gate lengths without the problems associated with the prior art techniques. In addition, graded shallow extension junctions are formed with reduced parasitic capacitance and improved gradual doping profiles that minimize hot carrier injections without compromising transistor performance.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for manufacturing an MOS structure on a semiconductor substrate, comprising the steps of:
    forming a gate dielectric layer over the semiconductor substrate;
    forming a polysilicon layer over said gate dielectric layer;
    forming a first mask layer over said polysilicon layer;
    patterning and etching said first mask layer to form a first gate mask;
    anisotropically etching said polysilicon layer using said first gate mask to form a polysilicon gate, wherein said polysilicon gate includes a gate part and a sidewall part with a re-entrant profile;
    implanting the semiconductor substrate with a dopant at a first energy and a first concentration to form a shallow extension junctions in the semiconductor substrate around said polysilicon gate, said implanting also performed through said sidewall part to form said shallow extension junction with a graded doping profile under said sidewall part; and
    removing the gate dielectric layer except under said gate part of said polysilicon gate.

2. The method as claimed in claim 1 wherein the step of anistropically etching said polysilicon layer includes the steps of controlling etching parameters, wherein said etching parameters include concentrations of etchants, temperature, RF power, DC bias, and magnetic field to form said re-entrant profile to control said graded doping profile.

3. The method as claimed in claim 1 wherein the step of implanting through said sidewall part forms said shallow extension junction with said graded doping profile inversely proportional to the thickness of the sidewall part above said shallow extension junction.

4. The method as claimed in claim 1 including the steps of:
    annealing said semiconductor substrate after the step of implanting the semiconductor with said dopant, wherein said annealing step results in a lateral diffusion of said shallow extension junctions toward the gate part of said polysilicon gate; and controlling said re-entrant profiles of said sidewall part, said first energy, said first concentration, or a combination thereof, so that said shallow extension junctions are formed at a distance away from said gate part of said polysilicon gate, whereby said lateral diffusion of said dopant under said gate part of said polysilicon gate is reduced.

5. The method as claimed in claim 1 including the steps of:
    forming a second mask layer over said first mask layer;
    patterning and etching said second mask layer using said first mask layer as an antireflective coatings to form a second gate mask prior to the step of etching said first mask layer to form said first gate mask; and
    removing said first gate mask and said second gate mask prior to the step of implanting the semiconductor substrate with said dopant.

6. The method as claimed in claim 1 wherein said first mask layer is a material selected from a group consisting of oxide and nitride.

7. The method as claimed in claim 1 including:
    forming a sidewall spacer under said sidewall part of said polysilicon gate;
    implanting the semiconductor substrate using said polysilicon gate and said sidewall spacer as a mask using said dopant at a second energy and a second concentration to form a deep junction; and
    annealing the semiconductor substrate.

8. A method for manufacturing MOS structures on a semiconductor substrate having first and second doping regions of different conductivity types, comprising the steps of:
    forming a gate dielectric layer over the semiconductor substrate;
    forming a polysilicon layer over said gate dielectric layer;
    forming a first mask layer over said polysilicon layer
    patterning and etching said first mask layer to form a first gate mask;
    anisotropically etching said polysilicon layer using said first gate mask to form first and second polysilicon gates, wherein said first and second polysilicon gates each include a gate part and a sidewall part with a re-entrant profile, and wherein said first polysilicon gate is over the first doping region and the second polysilicon gate is over the second doping region;
    removing said first gate mask and said second gate mask;
    depositing a third mask layer over said first and second polysilicon gates and said first and second doping regions;
    patterning and etching said third mask layer to expose said first polysilicon gate and said first doping region;
    implanting the first doping region with a first dopant at a first energy and a first concentration to form a first shallow extension junction in the first doping region around said first polysilicon gate, said implanting also performed through said sidewall part of the first polysilicon gate to form said first shallow extension junction with a first graded doping profile under said sidewall part;
    removing; the third mask layer;
    depositing a fourth mask layer over said first and second polysilicon gates and said first and second doping regions;
    patterning and etching said fourth mask layer to expose said second polysilicon gate and said second doping region;
    implanting said second doping region with a second dopant at a first energy and a first concentration to form a second shallow extension junction in the second doping region around said second polysilicon gate, said implanting also performed through said sidewall part of said second polysilicon gate to form said second shallow extension junction with a second graded doping profile under said sidewall part;
    removing the fourth mask layer; and
    removing the gate dielectric layer except under said gate parts of said first and second polysilicon gates.

9. The method as claimed in claim 8 wherein the step of anistropically etching said polysilicon layer includes the steps of controlling etching parameters, wherein said etching parameters include concentrations of etchants, temperature, RF power, DC bias, and magnetic field to form said re-entrant profile to control said graded doping profile.

10. The method as claimed in claim 8 wherein the steps of implanting through said sidewall parts form said shallow extension junctions, with said graded doping profiles inversely proportional to the thickness of the sidewall parts above said shallow extension junctions and said first and second graded doping profiles are the same.

11. The method as claimed in claim 8 including the steps of:
   annealing said semiconductor substrate after the step of implanting said second dopant, wherein said annealing step results in a lateral diffusion of said first and second shallow extension junctions respectively under said first and second polysilicon gates; and
   controlling said re-entrant profiles of said sidewall parts, said first energy, said first concentration, or a combination thereof, so that said shallow extension junctions are formed equally distal from said gate parts whereby said lateral diffusion under said first and second polysilicon gates is the same.

12. The method as claimed in claim 8 including:
   forming first and second sidewall spacers respectively under said sidewall parts of said first and second polysilicon gates;
   depositing a fifth mask layer over said first and second polysilicon gates, said first and second sidewall spacers, and said first and second doping regions;
   patterning and etching said fifth mask layer to expose said first polysilicon gate, said first sidewall spacer, and said first doping region;
   implanting the first doping region using said first and said sidewall spacers as a mask using said dopant at a second energy and a second concentration to form a first deep junction;
   depositing a sixth mask layer over said first and second polysilicon gates, said first and second sidewall spacers, and said first and second doping regions;
   patterning and etching said sixth mask layer to expose said second polysilicon gate, said second sidewall spacer, and said second doping region;
   implanting the second doping region using said second polysilicon gates and said second sidewall spacer as a mask using said second dopant at a second energy and a second concentration to form a second deep junction; and
   annealing the semiconductor substrate.

13. A method for manufacturing an MOS structure on a semiconductor substrate, comprising the steps of:
   forming a gate oxide layer over the semiconductor substrate;
   forming a polysilicon layer over said gate oxide layer;
   forming a first mask layer over said polysilicon layer;
   forming a second mask layer over said first mask layer;
   patterning and etching said second mask layer using said first mask layer as an antireflective coating to form a second gate mask;
   patterning and etching said first mask layer to form a first gate mask;
   anisotropically etching said polysilicon layer using said first gate mask to form a polysilicon gate, wherein said polysilicon gate includes a gate part and a sidewall part with a re-entrant profile, said anistropically etching said polysilicon layer includes the steps of controlling etching parameters wherein said etching parameters include concentrations of etchants, temperature, RF power, DC bias, and magnetic field to form said re-entrant profile;
   removing said first gate mask and said second gate mask;
   implanting the semiconductor substrate with a dopant of a second conductivitiy type at a first energy and a first concentration to form a shallow extension junction around said polysilicon gate said implanting also performed through said sidewall part to form said shallow extension junction with a graded doping profile inversely proportional to the thickness of said sidewall part above said shallow extension junction; and
   removing the gate oxide layer except under said gate sidewall part.

14. The method as claimed in claim 13 including the steps of:
   annealing said semiconductor substrate after the step of implanting the semiconductor substrate with said dopant, wherein said annealing step results in a lateral diffusion of said shallow extension junctions toward said gate part of said polysilicon gate.

15. A method for manufacturing a PMOS structure and an NMOS structure on a semiconductor substrate having an n-type and p-type doping regions, comprising the steps of:
   forming a gate dielectric layer over the semiconductor substrate;
   forming a polysilicon layer over said gate dielectric layer;
   forming a first mask layer over said polysilicon layer;
   patterning and etching said first mask layer to form a first gate mask;
   anisotropically etching said polysilicon layer using said first gate mask to form first and second polysilicon gates, wherein said first and second polysilicon gates each include a gate part and a sidewall part with a re-entrant profile, and wherein said first polysilicon gate is over the n-type doping region and the second polysilicon gate is over the p-type doping region;
   depositing a third mask layer over said first and second polysilicon gates and said n-type and p-type doping regions;
   patterning and etching said third mask layer to expose said first polysilicon gate and said n-type doping region;
   implanting the n-type doping region with a p-type dopant at a first energy and a first concentration to form a p-type shallow extension junction in the n-type doping region around said first polysilicon gate, said implanting also performed through said sidewall part of the first polysilicon gate to form said p-type shallow extension junction with a first graded doping profile under said sidewall part;
   depositing a fourth mask layer over said first and second polysilicon gates and said n-type and p-type doping regions;
   patterning and etching said fourth mask layer to expose said second polysilicon gate and said p-type doping region;
   implanting the p-type doping region with an n-type dopant at a first energy and a first concentration to form an n-type shallow extension junction in the p-type doping region around said second polysilicon gate, said implanting also performed through said sidewall part of said second polysilicon gate to form said n-type shallow extension junction with a second graded doping profile under said sidewall part; and removing the gate dielectric layer except under said gate parts of said first and second polysilicon gates.

16. The method as claimed in claim 15 wherein the step of anistropically etching said polysilicon layer includes the steps of controlling etching parameters, wherein said etching parameters include concentrations of etchants, temperature, RF power, DC bias, and magnetic field to form said re-entrant profiles to control said graded doping profiles.

17. The method as claimed in claim 15 wherein the steps of implanting through said sidewall parts forms said p-type and n-type shallow extension junctions with said graded doping profiles inversely proportional to the thickness of the sidewall parts above said p-type and n-type shallow extension junctions, and said first and second graded doping profiles are the same.

18. The method as claimed in claim 15 including the steps of:

controlling said re-entrant profiles of said sidewalls parts, said first energy, said first concentration, or a combination thereof, so that said p-type and n-type shallow extension junctions are formed equally distal from said gate parts, whereby said lateral diffusion under said first and second polysilicon gates is the same; and annealing said semiconductor substrate after the step of implanting said n-type dopant, wherein said annealing step results in a lateral diffusion of said p-type and n-type shallow extension junctions respectively under said first and second polysilicon gates.

* * * * *